United States Patent
Li et al.

(10) Patent No.: US 12,022,714 B2
(45) Date of Patent: Jun. 25, 2024

(54) PIXEL STRUCTURE AND DISPLAY DEVICE

(71) Applicant: GUANGDONG JUHUA PRINTED DISPLAY TECHNOLOGY CO., LTD., Guangzhou (CN)

(72) Inventors: Zhe Li, Guangzhou (CN); Jingyao Song, Guangzhou (CN); Dong Fu, Guangzhou (CN); Weidong Tang, Guangzhou (CN)

(73) Assignee: GUANGDONG JUHUA PRINTED DISPLAY TECHNOLOGY CO., LTD., Guangzhou (CN)

( * ) Notice: Subject to any disclaimer, the term of this patent is extended or adjusted under 35 U.S.C. 154(b) by 568 days.

(21) Appl. No.: 17/276,386

(22) PCT Filed: Sep. 20, 2019

(86) PCT No.: PCT/CN2019/107065
§ 371 (c)(1),
(2) Date: Mar. 15, 2021

(87) PCT Pub. No.: WO2020/057650
PCT Pub. Date: Mar. 26, 2020

(65) Prior Publication Data
US 2022/0037413 A1    Feb. 3, 2022

(30) Foreign Application Priority Data

Sep. 20, 2018  (CN) .......................... 201811102766.5
Sep. 20, 2018  (CN) .......................... 201811102786.2

(51) Int. Cl.
*H01L 27/32* (2006.01)
*H10K 59/122* (2023.01)
*H10K 59/38* (2023.01)

(52) U.S. Cl.
CPC ........... *H10K 59/38* (2023.02); *H10K 59/122* (2023.02)

(58) Field of Classification Search
CPC .... H10K 59/122; H10K 59/30; H10K 59/353; H10K 59/38; H10K 59/35;
(Continued)

(56) References Cited

U.S. PATENT DOCUMENTS

| | | | |
|---|---|---|---|
| 2006/0158095 A1* | 7/2006 | Imamura | H10K 50/824 313/506 |
| 2009/0295283 A1 | 12/2009 | Kim et al. | |

(Continued)

FOREIGN PATENT DOCUMENTS

| | | |
|---|---|---|
| CN | 102842273 A | 12/2012 |
| CN | 103943653 A | 7/2014 |

(Continued)

OTHER PUBLICATIONS

International Search Report from International Application No. PCT/CN2019/107065 dated Dec. 18, 2019.

*Primary Examiner* — Victor A Mandala
*Assistant Examiner* — Lawrence C Tynes, Jr.
(74) *Attorney, Agent, or Firm* — Dorsey & Whitney LLP

(57) ABSTRACT

The pixel structure includes a plurality of blue pixel sets, a plurality of yellow pixel sets, a first film filter, and a second film filter; the blue pixel set is composed of a plurality of blue sub-pixels arranged in a longitudinal direction, and the yellow pixel set is composed of a plurality of yellow sub-pixels arranged in the longitudinal direction; one blue pixel group and one yellow pixel group adjacent to each other in a horizontal direction constitute a hybrid pixel group, and a plurality of hybrid pixel sets are arranged in a transverse direction; in the hybrid pixel group, each blue sub-pixel is adjacent to at least two of the plurality of yellow (Continued)

sub-pixels, and the blue sub-pixel and at least two adjacent yellow sub-pixels constitute one pixel unit.

19 Claims, 3 Drawing Sheets

(58) Field of Classification Search
CPC ............. H10K 59/8723; H10K 50/125; H10K 50/131; H10K 50/844; H10K 50/13
See application file for complete search history.

(56) References Cited

U.S. PATENT DOCUMENTS

| | | | |
|---|---|---|---|
| 2010/0330468 A1 | 12/2010 | Kwon et al. | |
| 2012/0313123 A1* | 12/2012 | Kim | H10K 59/122 257/89 |
| 2012/0313844 A1* | 12/2012 | Im | H10K 50/8428 438/34 |
| 2014/0312339 A1* | 10/2014 | Fujita | H10K 59/38 257/40 |
| 2015/0349034 A1* | 12/2015 | Hack | H10K 59/351 257/40 |
| 2016/0133676 A1* | 5/2016 | Kim | H10K 59/122 438/35 |
| 2017/0207281 A1* | 7/2017 | Hack | H10K 50/852 |
| 2017/0338292 A1* | 11/2017 | Choi | H10K 59/352 |

FOREIGN PATENT DOCUMENTS

| | | |
|---|---|---|
| CN | 104009066 A | 8/2014 |
| CN | 104201289 A | 12/2014 |
| CN | 105206643 A | 12/2015 |
| CN | 105428553 A | 3/2016 |
| CN | 106530989 A | 3/2017 |
| CN | 107565048 A | 1/2018 |
| CN | 107731871 A | 2/2018 |
| CN | 107958923 A | 4/2018 |
| CN | 107966857 A | 4/2018 |
| CN | 108346679 A | 7/2018 |
| KR | 20140124095 A | 10/2014 |
| TW | 200642522 A | 12/2006 |

* cited by examiner size = 3d+3x size = 2d+2x

PIXEL STRUCTURE AND DISPLAY DEVICE

CROSS-REFERENCE TO RELATED APPLICATIONS

The present application is a U.S. National Stage of PCT International Application No. PCT/CN2019/107065 filed on Sep. 20, 2019, which claims the priority of Chinese Patent Application No. 201811102766.5, filed on Sep. 20, 2018, with the title of "PIXEL STRUCTURE AND DISPLAY DEVICE" and Chinese Patent Application No. 201811102786.2, filed on Sep. 20, 2018, with the title of "PIXEL STRUCTURE AND DISPLAY DEVICE". The disclosures of the above applications are incorporated herein by reference in its entirety.

TECHNICAL FIELD

The present application relates to the field of display technologies, and more particular, to a pixel structure and a display device.

BACKGROUND

OLED and QLED devices are prepared by an ink-jet printing technology, which is increasingly important in the display industry due to its advantages such as high material utilization, no need for high vacuum conditions and a fine mask, and being suitable for large-size displays. It is expected to become a mainstream technology in display manufacturing in the future.

One of the main technical challenges for the ink-jet printing technology is how to produce a display with high resolution. To achieve a printing device with high resolution, the density of RGB pixels needs to be increased, which means reducing the size of RGB sub-pixels. For the ink-jet printing technology, due to influences of many factors, such as an alignment error between a print head and a substrate, a motion error of a printer transmission mechanism, and deviation of a flight angle of an ink droplet (deviation from a vertical fall), there are certain limitations on "impact point accuracy" of the ink droplet. Therefore, in order to reduce the size of sub-pixels, there is also a certain limit. That is, the dimension of the length and width of the sub-pixels cannot be lower than a limit; otherwise, an actual impact point of the ink droplet may exceed a target pixel area and enter into an adjacent sub-pixel area, resulting in the problem of color mixing.

SUMMARY

In order to solve the above problems, it is necessary to provide a pixel structure and a display device, so as to reduce accuracy requirements on manufacturing equipment and technology to obtain a high-resolution display device.

A pixel structure is provided, including a plurality of blue pixel sets, a plurality of yellow pixel sets, a first film filter, and a second film filter;

the blue pixel set is composed of a plurality of blue sub-pixels arranged in a longitudinal direction, the yellow pixel set is composed of a plurality of yellow sub-pixels arranged in the longitudinal direction, one of the blue pixel sets and one of the yellow pixel sets adjacent in a transverse direction constitute a hybrid pixel set, a plurality of hybrid pixel sets are arranged in the transverse direction, and in the hybrid pixel sets, each of the blue sub-pixels is adjacent to at least two of the plurality of yellow sub-pixels, and the blue sub-pixel and the at least two yellow sub-pixel adjacent thereto constitute one pixel unit; and the first film filter is disposed in a light emitting direction of one of the yellow sub-pixels in each of the pixel units, the first film filter is configured to convert yellow light emitted by the yellow sub-pixel into red light, the second film filter is disposed in a light emitting direction of another of the yellow sub-pixels in each of the pixel units, and the second film filter is configured to convert yellow light emitted by the other yellow sub-pixel into green light.

A display device is provided, including the pixel structure described above.

The present application has the following beneficial effects:

In the pixel structure described above, one of at least two yellow sub-pixels in each yellow pixel set that are adjacent to the same blue sub-pixel converts yellow light into red light through the first film filter, and another of the at least two yellow sub-pixels in each yellow pixel set that are adjacent to the same blue sub-pixel converts yellow light into green light through the second film filter. When a luminous functional layer of the above pixel structure is produced by ink-jet printing, each blue pixel set and each yellow pixel set can be printed once respectively, and a plurality of small-sized sub-pixel structures can be formed, which can reduce accuracy requirements on printing equipment and technology and obtain a high-resolution display device.

DETAILED DESCRIPTION

To facilitate understanding of the present application, a more comprehensive description of the present application will be provided below with reference to the accompanying drawings. Preferred embodiments of the present application are given in the accompanying drawings. However, the present application may be implemented in many different forms and is not limited to the embodiments described herein. On the contrary, these embodiments are provided to provide a more thorough and comprehensive understanding of the disclosure of the present application.

Unless otherwise defined, all technical and scientific terms used herein have the same meaning as would normally be understood by those skilled in the art. The terms used herein in the specification of the present application are intended only to describe specific embodiments and are not intended to limit the present application. The term "and/or" used herein includes any and all combinations of one or more related listed items.

The "transverse direction" and "longitudinal direction" described herein represent two directions perpendicular to each other, and "transverse direction" or "longitudinal direction" does not refer to a particular direction.

Figure 1:
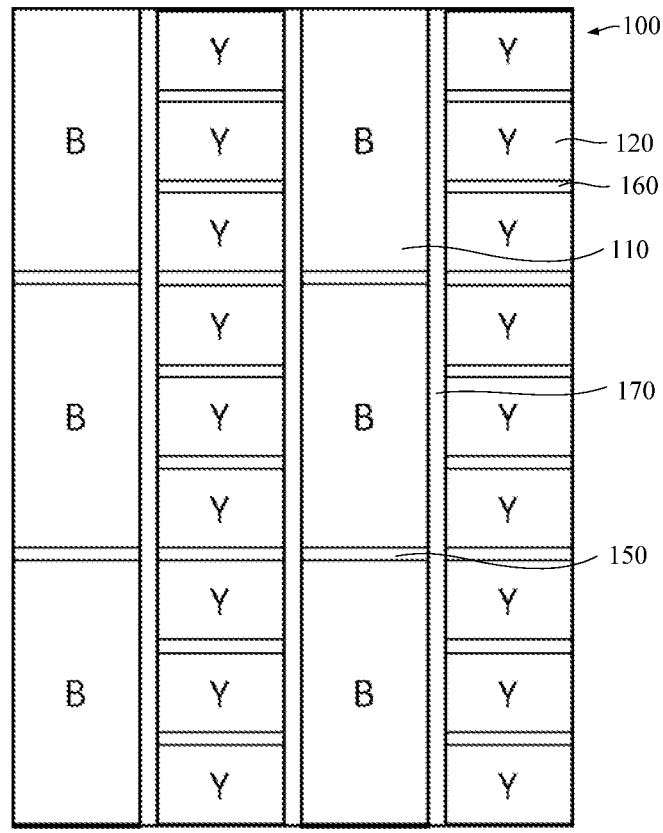
FIG. 1 is a schematic diagram of arrangement of pixels in a pixel structure according to an embodiment.
Figure 2:
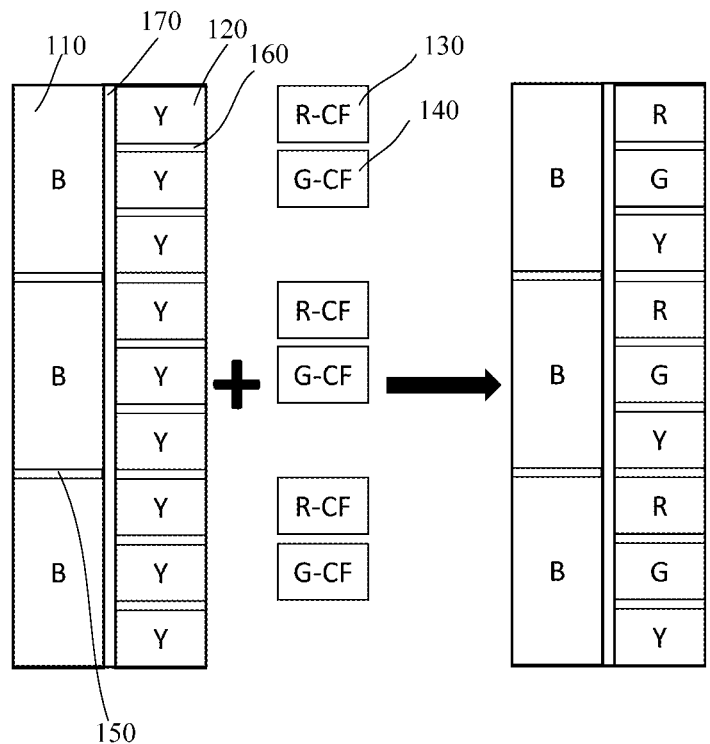
FIG. 2 is a schematic diagram of color conversion of a pixel structure according to an embodiment.

As shown in FIG. 1 and FIG. 2, a pixel structure 100 according to an embodiment of the present application includes a plurality of blue pixel sets, a plurality of yellow pixel sets, a first film filter 130, and a second film filter 140.

The blue pixel set is composed of a plurality of blue sub-pixels 110 arranged in a longitudinal direction. The yellow pixel set is composed of a plurality of yellow sub-pixels 120 arranged in the longitudinal direction. One blue pixel set and one yellow pixel set adjacent in a transverse direction constitute a hybrid pixel set, a plurality of hybrid pixel sets are arranged in the transverse direction, and in the hybrid pixel set, each blue sub-pixel 110 is adjacent to three yellow sub-pixels 120 sequentially arranged. That is, in one hybrid pixel set, the number of the blue sub-pixels 110 is three times the number of the yellow sub-pixels 120. The blue sub-pixels 110 and the three yellow sub-pixels 120 constitute one pixel unit.

A first film filter 130 is disposed in a light emitting direction of one of the yellow sub-pixels 120 in each of the pixel units, and the first film filter 130 is configured to convert yellow light emitted by the yellow sub-pixel 120 into red light. A second film filter 140 is disposed in a light emitting direction of another of the yellow sub-pixels 120 in each of the pixel units, and the second film filter 140 is configured to convert yellow light emitted by the other yellow sub-pixel 120 into green light.

It is understandable that positions of the blue pixel set (B) and the yellow pixel set (Y) in the hybrid pixel set are interchangeable, so that each pixel set can be arranged in an infinite variety of ways in the transverse direction, such as BYBYBYBY . . . , BYYBBYYB . . . , BYYBYBBY . . . , and so on. In the example shown in FIG. 1, the blue and yellow pixel sets are arranged alternately in the transverse direction, and the blue and yellow pixel sets in two adjacent hybrid pixel sets are arranged in the same order in the transverse direction. In another example, the blue and yellow pixel sets in the two adjacent hybrid pixel sets are arranged in a different order in the transverse direction, such as BYYBBYYB . . . in the above example. This arrangement can further reduce the accuracy requirements on printing equipment and technology and improve the resolution.

Figure 5:
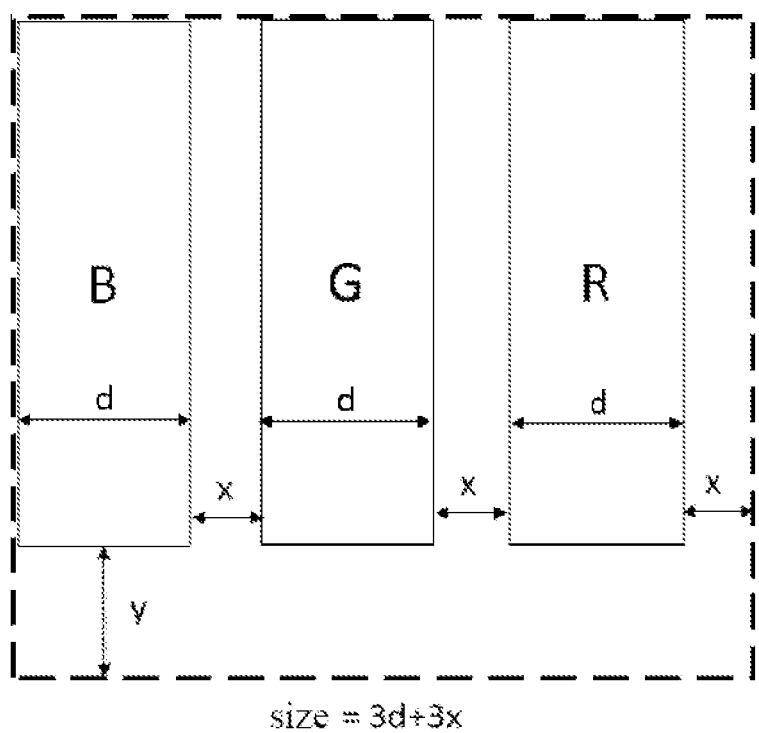
FIG. 5 is a pixel unit in a conventional RGB strip pixel structure.
Figure 6:
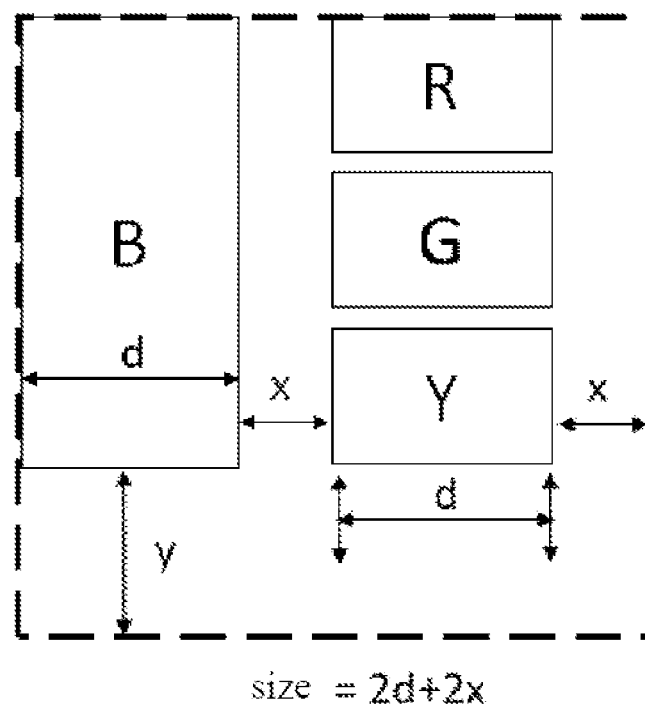
FIG. 6 is a pixel unit in a pixel structure according to an embodiment.

The pixel arrangement in this embodiment can effectively improve the display resolution in a case where the "impact point accuracy" of the ink droplet has a limit value. Specifically, the following is an example of a pixel unit composed of rectangular sub-pixels. As shown in FIG. 5 and FIG. 6, in a case where the "impact point accuracy" of the ink droplet has a limit value d, a size (pitch) of an RGB pixel unit is equal to 3d+3x (x is a distance between sub-pixels) when the conventional RGB strip arrangement is adopted. When the pixel structure 100 and the pixel arrangement of this embodiment are adopted, the size of an RGBY pixel unit is equal to 2d+2x, and the distance between the yellow sub-pixels 120 is smaller. That is, a distance between green and red sub-pixels correspondingly formed by color change is reduced, so that higher pixel arrangement density can be obtained and the display resolution can be improved.

In addition, as yellow light is close to white light, white light can be obtained through a combination of blue light and yellow light (B+Y) when the white light needs to be formed. Compared with the manner of forming the white light by a combination of blue light, red light, and green light (B+R+G), power consumption of the display device can be reduced.

When a luminous functional layer of the above pixel structure 100 is produced by ink-jet printing, each blue pixel set and each yellow pixel set can be printed once respectively, and a plurality of small-sized sub-pixel structures 100 can be formed, which can reduce accuracy requirements on printing equipment and technology and obtain a high-resolution display device.

It is understandable that in the display device, the above pixel structure 100 is disposed on a TFT array substrate with a patterned pixel electrode.

Figure 3:
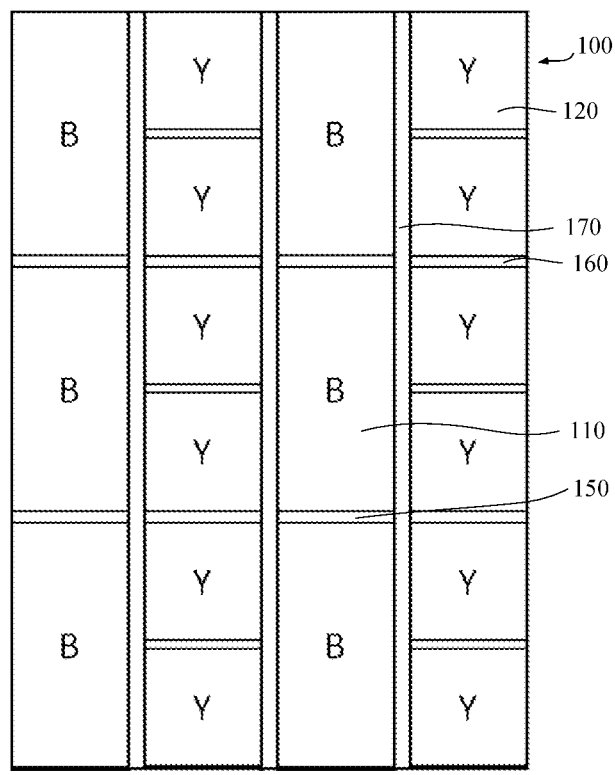
FIG. 3 is a schematic diagram of arrangement of pixels in a pixel structure according to another embodiment.
Figure 4:
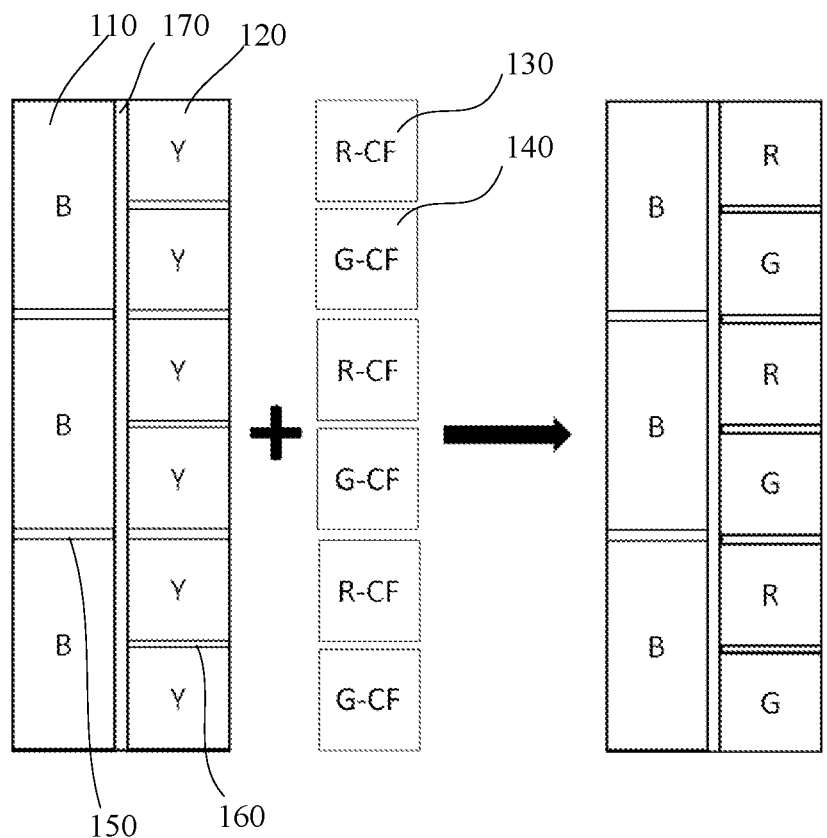
FIG. 4 is a schematic diagram of color conversion of a pixel structure according to another embodiment.

In another embodiment, as shown in FIG. 3 and FIG. 4, a pixel structure 100 in the present application includes a plurality of blue pixel sets, a plurality of yellow pixel sets, a first film filter 130, and a second film filter 140.

The blue pixel set is composed of a plurality of blue sub-pixels 110 arranged in a longitudinal direction. The yellow pixel set is composed of a plurality of yellow sub-pixels 120 arranged in the longitudinal direction. One blue pixel set and one yellow pixel set adjacent in a transverse direction constitute a hybrid pixel set, a plurality of hybrid pixel sets are arranged in the transverse direction, and in the hybrid pixel set, each blue sub-pixel 110 corresponds to two yellow sub-pixels 120. That is, the number of the blue sub-pixels 110 in one blue pixel set is twice the number of the yellow sub-pixels 120 in one yellow pixel set adjacent thereto. The blue sub-pixels 110 and the two yellow sub-pixels 120 adjacent thereto constitute one pixel unit.

A first film filter 130 is disposed in a light emitting direction of one of the yellow sub-pixels 120 in each of the pixel units, and the first film filter 130 is configured to convert yellow light emitted by the yellow sub-pixel 120 into red light. A second film filter 140 is disposed in a light emitting direction of another of the yellow sub-pixels 120 in each of the pixel units, and the second film filter 140 is configured to convert yellow light emitted by the other yellow sub-pixel 120 into green light.

It is understandable that positions of the blue pixel set (B) and the yellow pixel set (Y) in the hybrid pixel set are interchangeable, so that each pixel set can be arranged in an infinite variety of ways in the transverse direction, such as BYBYBYBY . . . , BYYBBYYB . . . , BYYBYBBY . . . , and so on. In the example shown in FIG. 3, the blue and yellow pixel sets are arranged alternately in the transverse direction, and the blue and yellow pixel sets in two adjacent hybrid pixel sets are arranged in the same order in the transverse direction. In another example, the blue and yellow pixel sets in the two adjacent hybrid pixel sets are arranged in a different order in the transverse direction, such as BYYBBYYB . . . in the above example. This arrangement can further reduce the accuracy requirements on printing equipment and technology and improve the resolution.

It is understandable that in the pixel structure of the present application, each pixel unit is not limited to including two yellow sub-pixels 120 or three yellow sub-pixels 120, and may also include more yellow sub-pixels 120. The present disclosure does not limit the number of yellow sub-pixels in each pixel unit. In the hybrid pixel set, each of the blue sub-pixels may be adjacent to two of the yellow sub-pixels, and the blue sub-pixel and the two yellow sub-pixels adjacent thereto constitute one pixel unit.

In some embodiments of the present application, "adjacent" means that a combination of one blue sub-pixel and at least two yellow sub-pixels sequentially arranged are basically or completely aligned in the transverse direction.

In this embodiment, as shown in FIG. 5 and FIG. 6, in a case where the "impact point accuracy" of the ink droplet has a limit value d, a size (pitch) of an RGB pixel unit is equal to 3d+3x (x is a distance between sub-pixels) when traditional RGB strip arrangement is adopted. When the pixel structure 100 and the pixel arrangement of this embodiment are adopted, the size of an RGBY pixel unit is equal to 2d+2x, and the distance between the yellow sub-pixels 120 is smaller. That is, a distance between green and red sub-pixels correspondingly formed by color change is reduced, so that higher pixel arrangement density can be obtained and the display resolution can be improved.

When a luminous functional layer of the above pixel structure 100 is produced by ink-jet printing, each blue pixel set and each yellow pixel set can be printed once respectively, and a plurality of small-sized sub-pixel structures 100 can be formed, which can reduce accuracy requirements on printing equipment and technology and obtain a high-resolution display device.

It is understandable that in the display device, the above pixel structure 100 is disposed on a TFT array substrate with a patterned pixel electrode.

In one example, a spectrum of light emitted by the yellow sub-pixel 120 includes a first peak and a second peak, wherein the first peak is located in a band of 490 nm to 550 nm, and the second peak is located in a band of 590 nm to 650 nm.

In this example, a yellow light luminescent material with double emission peaks is used, and the two emission peaks are located in a green light band and a red light band respectively. Compared with the conventional yellow light luminescent material with only one emission peak located in a yellow light band (generally between 540 nm and 580 nm), higher-efficiency green light and red light can be obtained after color conversion. This is because a luminescent spectrum of the conventional yellow light luminescent material with only one emission peak located in the yellow light band covers a green light band and a red light band, but the strongest part is still in the yellow light band. Therefore, green light and red light obtained by the traditional yellow light luminescent material after color conversion of the film filter are not strong, which affects the display effect.

Two peaks in a spectrum of light emitted by the yellow sub-pixel 120 may be generated by a luminescent material, such as a yellow phosphor material containing Pt, and may also be generated by two luminescent materials that emit green light and red light respectively, such as a green phosphor material containing Ir and a red phosphor material containing Ir.

In addition, the inventor finds in a testing process that, during luminescence of the luminescent material, blue light has a higher energy, and is easier to transfer energy to red and green light, which have lower energy levels; therefore, the blue light luminescent material blended with luminescent materials in other colors has a poor luminous effect, such as the blue light luminescent material is blended with the red light luminescent material and the green light luminescent material in a sub-pixel, due to the energy transfer, it is difficult to obtain light that emits red, green, and blue colors at the same time to form white light. In this example, the yellow light luminescent material with the double emission peaks or two luminescent materials that emit green light and red light respectively are blended in a luminous layer. Since energy levels of the green light and the red light are not very different, it is easy to form yellow light by emitting green light and red light at the same time.

Optionally, the first film filter 130 and the second film filter 140 may be color conversion films (CCFs) or color filters (CFs), or the like. Specifically, the first film filter 130 may be a red color conversion film or a green color filter, so as to filter and block components in the green light band of the yellow light emitted by the yellow sub-pixel 120 and let components in the red light band pass through. The second film filter 140 may be a green color conversion film or a red color filter, so as to filter and block components in the red light band of the yellow light emitted by the yellow sub-pixel 120 and let components in the green light band pass through.

In one example, in the pixel unit, an area of each yellow sub-pixel 120 is less than that of the blue sub-pixel 110. The blue sub-pixel 110 has a large area, to compensate the problems of a low luminescence rate and a short service life of the blue sub-pixel 110 through the large area of the blue sub-pixel 110. For example, when the pixel unit is composed of one blue sub-pixel 110 and three yellow sub-pixels 120, a ratio of areas of the three yellow sub-pixels 120 to an area of the blue sub-pixel 110 is 1:1:1:3; and when the pixel unit is composed of one blue sub-pixel 110 and two yellow sub-pixels 120, a ratio of areas of the two yellow sub-pixels 120 to an area of the blue sub-pixel 110 is 1:1:2.

In one example, the blue sub-pixel 110 and the yellow sub-pixel 120 are both rectangular, which are convenient for design and production.

As shown in FIG. 1 and FIG. 3, a first pixel definition layer 150 is provided between two adjacent blue sub-pixels 110 in the blue pixel set, a second pixel definition layer 160 is provided between two adjacent yellow sub-pixels 120 in the yellow pixel set, and a third pixel definition layer 170 is provided between the blue pixel set and the yellow pixel set.

In one example, the height of the first pixel definition layer 150 and the height of the second pixel definition layer 160 are both lower than the height of the third pixel definition layer 170. In one example, the height of the first pixel definition layer 150 and the height of the second pixel definition layer 160 may be selected as 10 nm to 500 nm, and the height of the third pixel definition layer 170 may be selected as 500 nm to 1500 nm. The height of the third pixel definition layer 170 is larger, so as to define an ink deposition area of each pixel set, which can prevent ink overflow from causing color crosstalk that reduces display quality.

Further, in one example, the blue sub-pixel 110 has a first luminous functional layer, the height of the first luminous functional layer is higher than the height of the first pixel definition layer 150 and lower than the height of the third pixel definition layer 170; the yellow sub-pixel 120 has a second luminous functional layer, and the height of the second luminous functional layer is higher than the height of the second pixel definition layer 160 and lower than the height of the third pixel definition layer 170.

One of the main technical challenges for the ink-jet printing technology is how to produce a display with high uniformity. In an evaporation technology, a uniform film is relatively easy to be obtained by depositing a material "vapor cloud" uniformly distributed in space onto a substrate. Ink-jet printing involves using hundreds or thousands of nozzles to spray ink droplets into different pits of pixels. Because the current technology cannot achieve high consistency in the volume, speed, and angle of flight of the ink droplets emitted from each nozzle, it is difficult to ensure that volumes of ink droplets printed into each pixel remain the same. In addition, the change of the working state of the nozzle with time may also cause the drift of parameters such as the volumes of the ink droplets in the process of long-term continuous ink-jet of the nozzle. Therefore, how to ensure the consistency in volumes of ink droplets in different sub-pixels in the same color is a key problem in order to obtain printing OLED and QLED panels with good uniformity.

With respect to the above problems, in this example, the height of the first luminous functional layer is higher than the height of the first pixel definition layer 150, and the height of the second luminous functional layer is higher than the height of the second pixel definition layer 160. That is, in ink-jet printing, the ink overflows the first pixel definition layer 150 and the second pixel definition layer 160, respectively, so that upper surfaces of first luminous functional layers of different blue sub-pixels 110 in the blue pixel set are continuous and uniform, upper surfaces of second luminous functional layers of different yellow sub-pixels 120 are also continuous and uniform, and good consistency in thicknesses of the luminous functional layers can be obtained between different sub-pixels, which is conducive to improving film formation uniformity and obtain a display device with high-uniformity luminous functional layers.

Further, in one example, surfaces of the first pixel definition layer 150 and the second pixel definition layer 160 are lyophilic. In this example, when ink-jet printing is carried out to form a luminous functional layer, the ink can flow freely between pixel pits of the sub-pixels in the same blue pixel set and pixel pits of the sub-pixels in the same yellow pixel set, which is conducive to further improving the film formation uniformity.

Further, in one example, a surface of the third pixel definition layer 170 is lyophobic. When ink-jet printing is carried out to form a luminous functional layer, the chance of ink crossing different pixel sets to lead to color mixing can be reduced, which is conducive to further improving the film formation uniformity.

In one example, two adjacent blue sub-pixels 110 in the blue pixel set are arranged in axial symmetry, two adjacent yellow sub-pixels 120 in the yellow pixel set are arranged in axial symmetry, which can form a neat pixel layout and can also make the volume of ink of sub-pixels in the same pixel set the same, thereby helping improve the film formation uniformity.

Further, this specific implementation further provides a display device, including the pixel structure 100 in any of the above examples.

In the pixel structure 100, one of three yellow sub-pixels 120 in each yellow pixel set that are adjacent to the same blue sub-pixel 110 converts yellow light into red light through the first film filter 130, and another of the three yellow sub-pixels 120 in each yellow pixel set that are adjacent to the same blue sub-pixel 110 converts yellow light into green light through the second film filter 140, so as to form an RGBY pixel unit together with the blue sub-pixel 110 and the remaining yellow sub-pixel 120 in the three yellow sub-pixels 120; or one of two yellow sub-pixels 120 in each yellow pixel set that are adjacent to the same blue sub-pixel 110 converts yellow light into red light through the first film filter 130, and the other of the two yellow sub-pixels 120 in each yellow pixel set that are adjacent to the same blue sub-pixel 110 converts yellow light into green light through the second film filter 140, so as to form an RGB pixel unit together with the blue sub-pixel 110. When a luminous functional layer of the above pixel structure 100 is produced by ink-jet printing, each blue pixel set and each yellow pixel set can be printed once respectively, and a plurality of small-sized sub-pixel structures 100 can be formed, which can reduce accuracy requirements on printing equipment and technology and obtain a high-resolution display device.

Technical features of the above embodiments may be arbitrarily combined. For the sake of brevity, not all possible combinations of the technical features in the above embodiments are described. However, provided that there is no contradiction in the combinations of the technical features, the combinations should be considered as the scope of the disclosure of the specification.

The above embodiments express only several implementations of the present disclosure, and the descriptions thereof are relatively specific and detailed, but they cannot be interpreted as limitations on the scope of the disclosure. It should be pointed out that, for those of ordinary skill in the art, a number of transformations and improvements can be made with departing from the idea of the disclosure, all of which belong to the protection scope of the present disclosure. Therefore, the protection scope of the disclosure should be subject to the appended claims.

The invention claimed is:

1. A pixel structure, comprising:
a plurality of blue pixel sets;
a plurality of yellow pixelsets;
a first film filter; and
a second film filter;
wherein the blue pixel set is composed of a plurality of blue sub-pixels arranged in a longitudinal direction, the yellow pixel set is composed of a plurality of yellow sub-pixels arranged in the longitudinal direction, one of the blue pixel sets and one of the yellow pixel sets adjacent in a transverse direction constitute a hybrid pixel set, a plurality of hybrid pixel sets are arranged in the transverse direction, and in the hybrid pixel sets, each of the blue sub-pixels is adjacent to at least two of the plurality of yellow sub-pixels, and the blue sub-pixel and the at least two yellow sub-pixel adjacent thereto constitute one pixel unit; and
the first film filter is disposed in a light emitting direction of one of the yellow sub-pixels in each of the pixel units, the first film filter is configured to convert yellow light emitted by the yellow sub-pixel into red light, the second film filter is disposed in a light emitting direction of another of the yellow sub-pixels in each of the pixel units, and the second film filter is configured to convert yellow light emitted by the other yellow sub-pixel into green light;
wherein a first pixel definition layer is provided between two adjacent blue sub-pixels in the blue pixel set, a second pixel definition layer is provided between two adjacent yellow sub-pixels in the yellow pixel set, and third pixel definition layer is provided between the blue pixel set and the yellow pixel set, and a height of the first pixel definition layer and a height of the second pixel definition layer are both lower than a height of the third pixel layer.

2. The pixel structure according to claim 1, wherein in the hybrid pixel set, each of the blue sub-pixels is adjacent to two of the yellow sub-pixels, and the blue sub-pixel and the two yellow sub-pixels adjacent thereto constitute one pixel unit.

3. The pixel structure according to claim 2, wherein a ratio of areas of the two yellow sub-pixels in the one pixel unit to an area of the blue sub-pixel adjacent thereto is 1:1:2.

4. The pixel structure according to claim 1, wherein in the hybrid pixel set, each of the blue sub-pixels is adjacent to three yellow sub-pixels sequentially arranged, and the blue sub-pixel and the three yellow sub-pixels adjacent thereto constitute one pixel unit.

5. The pixel structure according to claim 4, wherein a ratio of areas of the three yellow sub-pixels in the one pixel unit to an area of the blue sub-pixel adjacent thereto is 1:1:1:3.

6. The pixel structure according to claim 1, wherein a spectrum of light emitted by the yellow sub-pixel comprises a first peak and a second peak, the first peak is located in a band of 490 nm to 550 nm, and the second peak is located in a band of 590 nm to 650 nm.

7. The pixel structure according to claim 1, wherein in the pixel unit, an area of each of the yellow sub-pixel is less than that of the blue sub-pixel.

8. The pixel structure according to claim 1, wherein the first film filter and the second film filter are color conversion films or color filters.

9. The pixel structure according to claim 1, wherein the height of the first pixel definition layer and the height of the second pixel definition layer range from 10 nm to 500 nm.

10. The pixel structure according to claim 1, wherein the height of the third pixel definition layer ranges from 500 nm to 1500 nm.

11. The pixel structure according to claim 1, wherein the blue sub-pixel has a first luminous functional layer, a height of the first luminous functional layer is lower than the height of the third pixel definition layer, the yellow sub-pixel has a second luminous functional layer, and a height of the second luminous functional layer is lower than the height of the third pixel definition layer.

12. The pixel structure according to claim 11, wherein the height of the first luminous functional layer is higher than the height of the first pixel definition layer.

13. The pixel structure according to claim 12, wherein surfaces of the first pixel definition layer and the second pixel definition layer are lyophilic.

14. The pixel structure according to claim 12, wherein a surface of the third pixel definition layer is lyophobic.

15. The pixel structure according to claim 11, wherein the height of the second luminous functional layer is higher than the height of the second pixel definition layer.

16. The pixel structure according to claim 1, wherein the blue sub-pixel and the yellow sub-pixel are both rectangular.

17. The pixel structure according to claim 1, wherein two adjacent blue sub-pixels in the blue pixel set are arranged in axial symmetry.

18. The pixel structure according to claim 1, wherein two adjacent yellow sub-pixels in the yellow pixel set are arranged in axial symmetry.

19. A display device, comprising the pixel structure according to claim 1.

* * * * *